United States Patent [19]

Kim et al.

[11] Patent Number: 5,793,665
[45] Date of Patent: Aug. 11, 1998

[54] HIGH-SPEED SYNCHRONOUS MASK ROM WITH PIPELINE STRUCTURE

[75] Inventors: Jae Hyeoung Kim; Byoung Jin Yoon, both of Kyoungkido, Rep. of Korea

[73] Assignee: Hyundai Electronics Industries Co., Ltd., Kyoungkido, Rep. of Korea

[21] Appl. No.: 672,996

[22] Filed: Jul. 1, 1996

[30] Foreign Application Priority Data

Jun. 30, 1995 [KR] Rep. of Korea ............... 1995-19167

[51] Int. Cl.$^6$ ............................................. G11C 17/00
[52] U.S. Cl. ............................................. 365/104; 365/233
[58] Field of Search .............................. 365/233; 327/154

[56] References Cited

U.S. PATENT DOCUMENTS

| | | | |
|---|---|---|---|
| 4,644,501 | 2/1987 | Nagasawa | 365/203 |
| 5,132,554 | 7/1992 | Hiramatsu et al. | 327/154 |
| 5,287,472 | 2/1994 | Horst | 365/189.03 |
| 5,386,391 | 1/1995 | Watanabe | 365/233 |
| 5,392,423 | 2/1995 | Yetter | 365/233 |

*Primary Examiner*—David C. Nelms
*Assistant Examiner*—Michael T. Tran
*Attorney, Agent, or Firm*—Jacobson, Price, Holman & Stern, PLLC

[57] ABSTRACT

The present invention discloses a mask ROM having a pipeline structure using simple latch circuits. Accordingly, the mask ROM according to the present invention improves its speed and guarantees the security of the output data, by proving a clock generator and a plurality of latch circuit for storing the outputs from each of the element therein, being synchronized with the internal clock signal from the clock generating means.

14 Claims, 5 Drawing Sheets

$T_{RC}$ : READ CYCLE TIME
$T_{AA}$ : ADDRESS ACCESS TIME

HIGH-SPEED SYNCHRONOUS MASK ROM WITH PIPELINE STRUCTURE

BACKGROUND OF THE INVENTION

1. Field of the Invention

The present invention relates to a mask ROM, and more particularly, to a high-speed synchronous mask ROM with a simple memory cell structure.

2. Description of the Prior Art

Generally, mask ROMs can be classified into two classes, synchronous mask ROM and asynchronous mask ROM.

FIG. 1 is a schematic view illustrating a conventional synchronous mask ROM. The synchronous mask ROM shown in FIG. 1 performs the same operation as a typical read only memory device. That is to say, the memory cell in a memory cell array 17 is selected by a row decoding part 10 and a column decoding part 20. Data stored in the memory cells, which are amplified by a sense amplifier 18, are output to an external circuit through an output buffer 19. The row decoding part 10 consists of an X-address buffer 11 an X-predecoder 12 and a X-decoder 13, and the column decoding part 20 consists of an Y-address buffer 14, an Y-predecoder 15 and an Y-decoder 16.

The row decoding part 10 selects a word line in the memory cell array 17, by switching transistors therein according to input X-addresses. Likewise, the column decoding part 20 selects a bit line in the memory cell array 17, by switching transistors therein according to input Y-addresses. Accordingly, one memory cell in the memory cell array 17 is selected by the row and columns decoding parts 10 and 20. The selected data are amplified by the sense amplifier 18 and are output into the output buffer 19.

FIG. 2 is a timing diagram showing the relation between the input addresses and the output signals. In FIG. 2, $T_{RC}$ is the read cycle time and $T_{AA}$ is the address access time. This conventional mask ROM typically operates at a speed of 120 ns, and particularly, in page mode, 20 to 30 ns.

Although the conventional mask ROM can implement the highly integrated memory chip, there exists a problem in that the mask ROM can not be operated at a high speed because of a small amount of current due to the small size of the memory cell. That is, it takes a lot of time to transfer data from the memory cell to the output buffer. Accordingly, it is difficult for the mask ROM to be applied to an office automation machine such as a printer and an electronic pocketbook, or a game machine which desires high speed operation.

SUMMARY OF THE INVENTION

An object of the present invention is to provide a high-speed synchronous mask ROM capable of reducing a access time using a pipeline structure and guaranteeing the reliability of the output data.

In accordance with the present invention, there is provided a read only memory device having a memory cell array having NAND-type cells or OR-type cells, a first decoding means for selecting a word line in the memory cell array, a second decoding means for selecting a bit line in the memory cell array, an amplifier for amplifying data read out from the memory cell array and an output buffering means for outputting amplified data, the read only device comprising a clock generating means for receiving an external clock signal and outputting internal clock signals, and a plurality of storing means for storing the outputs from each of the elements, being synchronized with the internal clock signal from the clock generating means.

BRIEF DESCRIPTION OF THE DRAWINGS

Other objects and aspects of the invention will become apparent from the following description of embodiments with reference to the accompanying drawings, in which.

DESCRIPTION OF THE PREFERRED EMBODIMENTS

Hereinafter, a synchronous mask ROM in accordance with the present invention will be described in detail referring to FIGS. 3 to 6.

Figure 1:
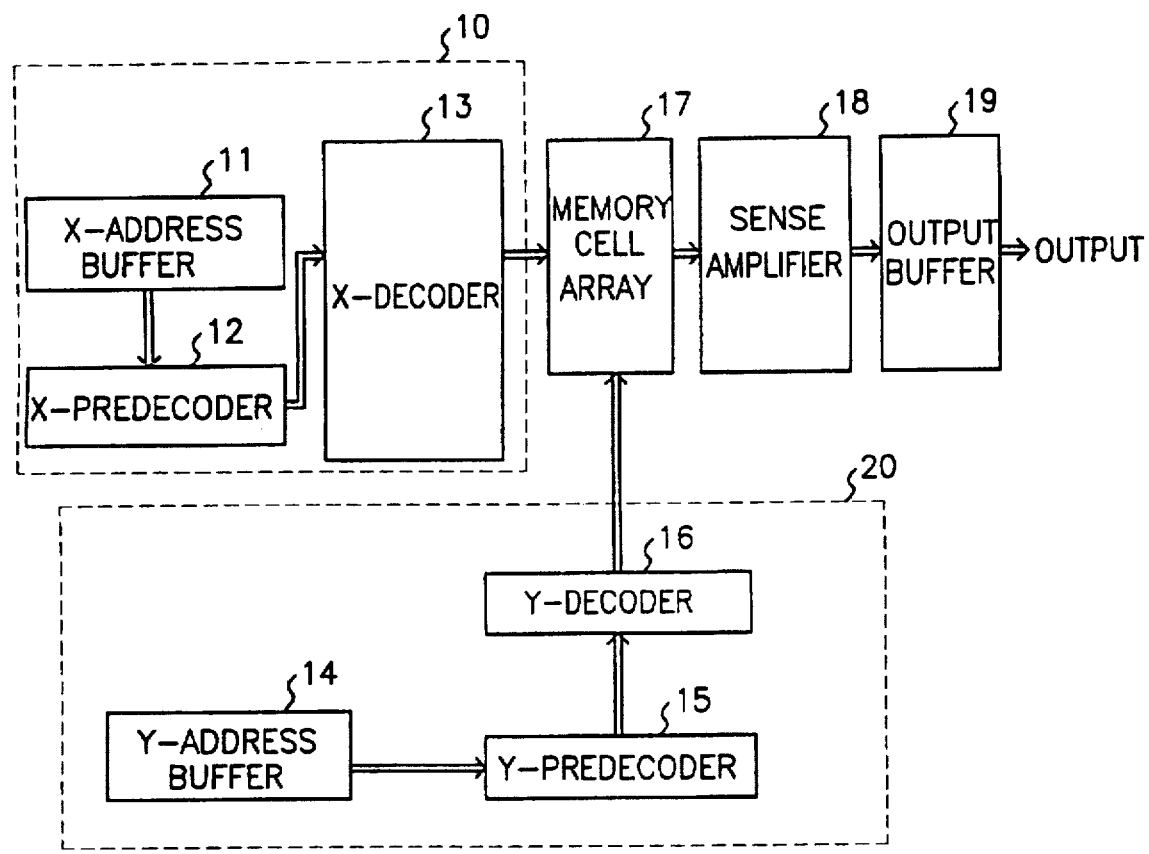
FIG. 1 is a schematic view illustrating a conventional synchronous mask ROM.
Figure 2:
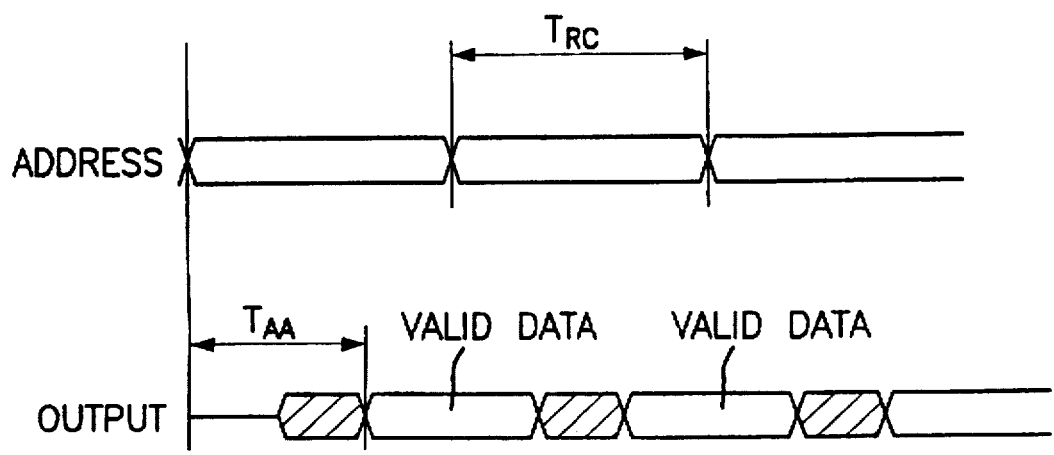
FIG. 2 is a timing diagram showing the relation between input address and output signal in FIG. 1.
Figure 3:
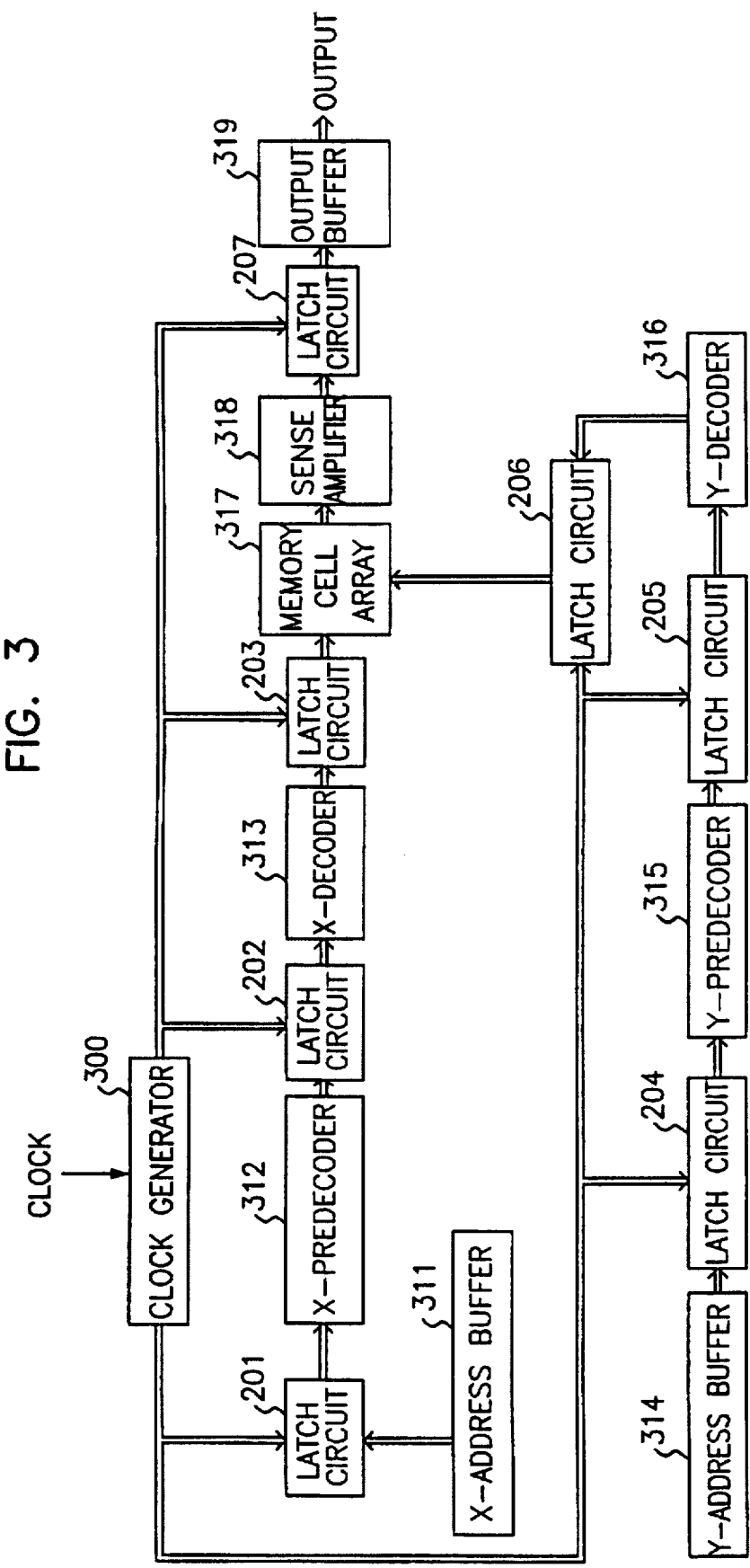
FIG. 3 is a schematic view illustrating a synchronous mask ROM in accordance with the present invention.

First, FIG. 3 is a schematic view illustrating a synchronous mask ROM. As shown in FIG. 3, the synchronous mask ROM in accordance with the present invention includes a memory cell array 317, a sense amplifier 318, an output buffer 319, an X-address buffer 311, an X-predecoder 312, an X-decoder (row decoder) 313, an Y-address buffer 314, an Y-predecoder 315 and an Y-decoder (column decoder) 316. Also, the elements in FIG. 3 perform the same operation as those in FIG. 1.

Furthermore, the mask ROM in the present invention has a clock generator 300 and latch circuits 201 to 207 between the elements in order to form a pipeline structure.

The clock generator 300 receives an external clock signal and then outputs an internal clock signal to the latch circuits 201 to 207. The clock signal generated by the clock generator 300 is determined by a delay time of the latch circuit which has the longest operating time. Accordingly, cell data corresponding to addresses are output at a high speed after a lapse of the constant latency clock time so that a high speed access cam be realized. The latch circuits 201 to 207 are made of D-flip flops or registers.

The output from each latch circuit is transferred to an adjacent element, being synchronized with the clock signal from the clock generator 300. Of course, the number of latch circuits used between the elements in the mask ROM can be controlled as occasion demands.

Figure 4:
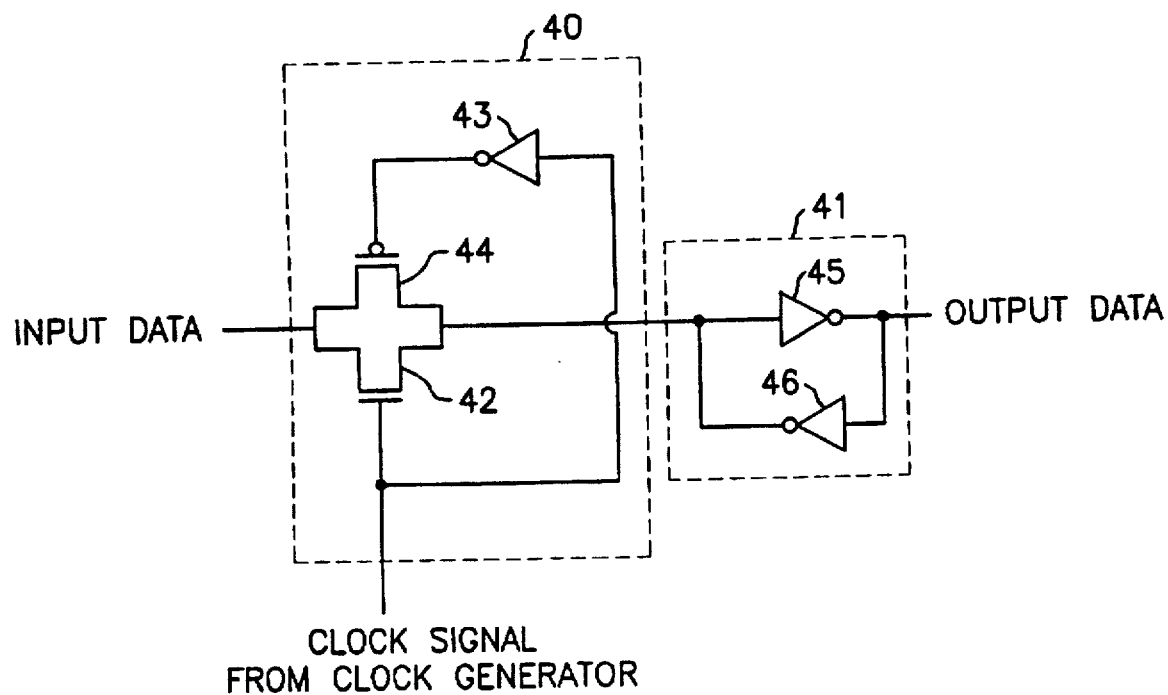
FIG. 4 is a schematic view illustrating the latch circuit having a switching circuit.

FIG. 4 is a schematic view illustrating the latch circuit having a switching circuit which is controlled by the clock signal. In FIG. 4, the latch circuit consists of a switching circuit 40 and a latch part 41. When the clock signal is input from the clock generator into the switching circuit 40, an NMOS transistor 42 is turned on and a PMOS transistor 43 is also turned on through an inverter 43. The latch part 41 consists of two inverters 45 and 46 which are formed on the feed-back loop.

Figure 5:
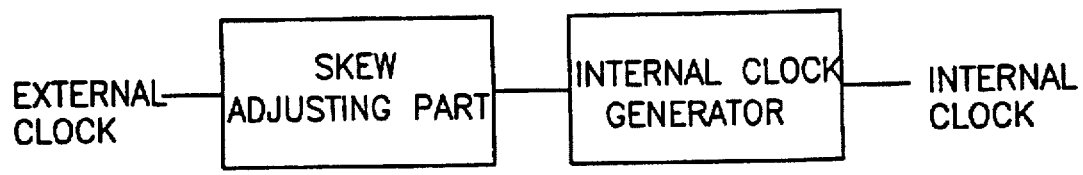
FIG. 5 is a schematic view illustrating the clock generator in FIGS. 3.

FIG. 5 is a schematic view illustrating the clock generator in FIG. 3. The clock signals, which are input into the latch circuits 201 to 207 in FIG. 3, are generated by the skew adjusting part and internal clock generator. The skew adjusting part, such as PLL (phase-locked loop), corrects the external clock having a distortion and then the internal clock generator generates the internal clock signals which are propagated to each of the latch circuits 201 to 207 without the distortion.

Figure 6:
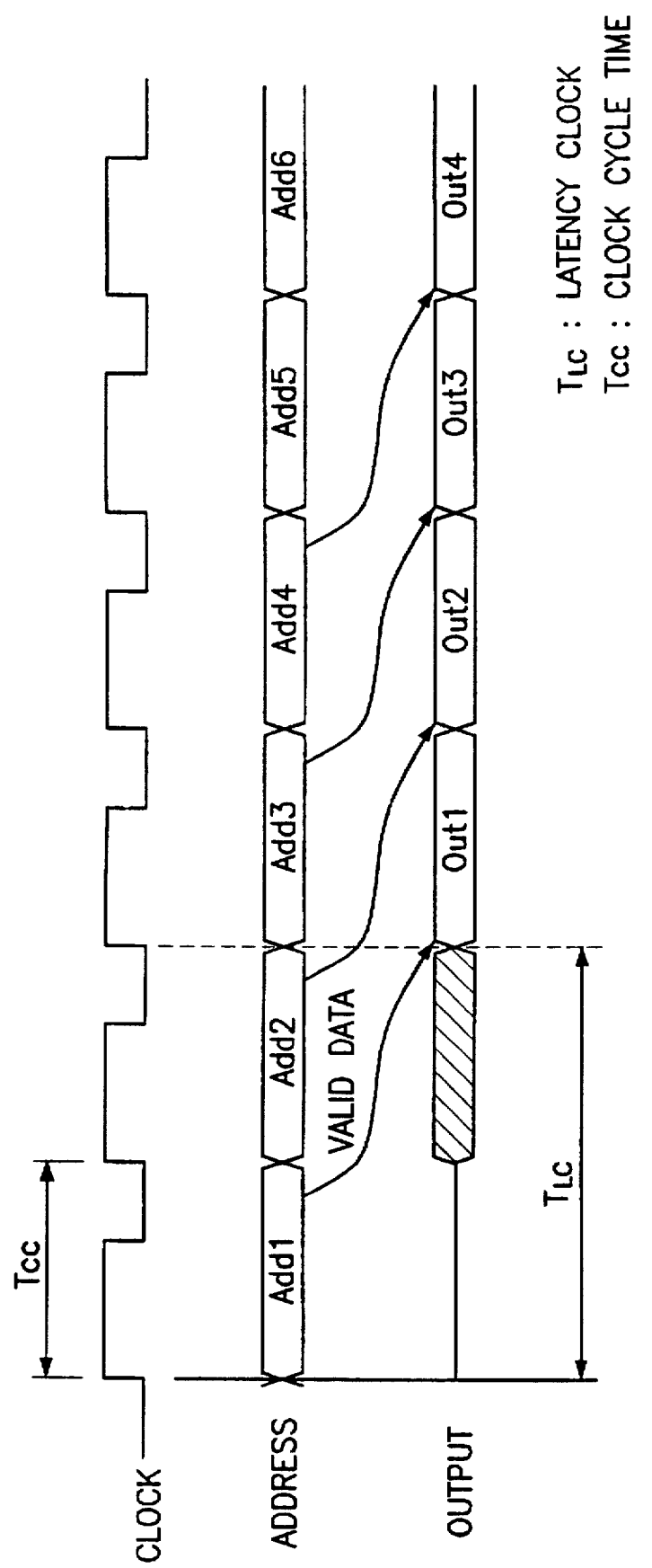
FIG. 6 is a timing diagram showing the relation between input address and output signal in FIG. 3.

FIG. 6 is a timing diagram showing the relation between the input addresses and the output signals in FIG. 3. As shown in FIG. 6, addresses are input into the address buffer, being synchronized with the clock signal from the clock generator. The first output data is output when the third clock signal is generated. That is, cell data corresponding to addresses are output after a lapse of the predetermined latency clock time $T_{LC}$ ($T_{LC}$ is $2T_{CC}$), however, with the lapse of the latency clock time $T_{LC}$, the sequential output data are output at a high speed. Particularly, in page mode, synchronous mask ROM according to the present invention can operate at a speed of 20 to 30 ns.

As apparent from description, the present invention has effects in that the speed of the mask ROM is improved by realizing the pipeline structure using simple latch circuits, and in that the security of the output data can be guaranteed by making the delay time of the latch circuit, which has the longest operating time, its clock cycle time.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A read only memory device having a memory cell array, an amplifier for amplifying data read out from the memory cell array and an output buffering means for outputting amplified data, comprising:

a clock generating means for receiving an external clock signal and outputting internal clock signals;

a first switching means for connecting the first decoding means to the memory cell array, being synchronized with the internal clock signal from the clock generating means;

a second switching means for connecting the second decoding means to the memory cell array, being synchronized with the internal clock signal from the clock generating means;

a third switching means for connecting the output buffering means to the memory cell array, being synchronized with the internal clock signal from the clock generating means;

a first decoding means for selecting a word line in the memory cell array, comprising:
  a first means for buffering row address signals;
  a second means for predecoding the outputs from the first means; and
  a third means for decoding the outputs from the second means;

a second decoding means for selecting a bit line in the memory cell array, comprising:
  a fourth means for buffering column address signals;
  a fifth means for predecoding the outputs from the fourth means; and
  a sixth means for decoding the outputs from the fifth means;

a fourth switching means for connecting the first means to the second means, being synchronized with the internal clock signal from the clock generating means;

a fifth switching means for connecting the second means to the third means, being synchronized with the internal clock signal from the clock generating means;

a sixth switching means for connecting the fourth means to the fifth means, being synchronized with the internal clock signal from the clock generating means; and a seventh switching means for connecting the fifth means to the sixth means, being synchronized with the internal clock signal from the clock generating means.

2. The read only memory device in accordance with claim 1, wherein the clock generating means further comprises a skew adjusting means for correcting a wave distortion from the external clock signal.

3. The read only memory device in accordance with claim 2, wherein the skew adjusting means is a phase-locked loop.

4. A read only memory device having a memory cell array, an amplifier for amplifying data read out from the memory cell array and an output buffering means for outputting amplified data, comprising:

a clock generating means for receiving an external clock signal and outputting internal clock signals;

a first storing means for storing the outputs from the first decoding means between the first decoding means and the memory cell array, being synchronized with the internal clock signal from the clock generating means;

a second storing means for storing the outputs from the second decoding means between the second decoding means and the memory cell array, being synchronized with the internal clock signal from the clock generating means;

a third storing means for storing the outputs from the memory cell array between the memory cell array and the output buffering means, being synchronized with the internal clock signal from the clock generating means;

a first decoding means for selecting a word line in the memory cell array, comprising:
  a first means for buffering row address signals;
  a second means for predecoding the outputs from the first means; and
  a third means for decoding the outputs from the second means;

a second decoding means for selecting a bit line in the memory cell array, comprising:
  a fourth means for buffering column address signals;
  a fifth means for predecoding the outputs from the fourth means; and
  a sixth means for decoding the outputs from the fifth means;

a fourth storing means for storing the outputs from the first means between the first means and the second means, being synchronized with the internal clock signal from the clock generating means;

a fifth storing means for storing the outputs from the second means between the second means and the third means, being synchronized with the internal clock signal from the clock generating means;

a sixth storing means for storing the outputs from the fourth means between the fourth means and the fifth means, being synchronized with the internal clock signal from the clock generating means; and a seventh storing means for storing the outputs from the fifth means between the fifth means and the sixth means, being synchronized with the internal clock signal from the clock generating means.

5. The read only memory device in accordance with claim 4, wherein the clock generating means further comprises a skew adjusting means for correcting a wave distortion from the external clock signal.

6. The read only memory device in accordance with claim 4, wherein the first, second and third storing means comprises:

a switching means controlled by the internal clock signal from the clock generating means; and a latching means coupled to the switching means, wherein the latching means stores the outputs therefrom.

7. The read only memory device in accordance with claim 4, wherein the fourth, fifth, sixth and seventh storing means comprises:

a switching means controlled by the internal clock signal from the clock generating means; and a latching means coupled to the switching means, wherein the latching means stores the outputs therefrom.

8. The read only memory device in accordance with claim 4, wherein the first, second and third storing means are registers or D flip-flops.

9. The read only memory device in accordance with claim 4, wherein the fourth, fifth, sixth and seventh storing means are registers or D flip-flops.

10. The read only memory device in accordance with claim 5, wherein the skew adjusting means is a phase-locked loop.

11. A read only memory device having a memory cell array having NAND-type cells or OR-type cells, a first decoding means for selecting a word line in the memory cell array, a second decoding means for selecting a bit line in the memory cell array, an amplifier for amplifying data read out from the memory cell array and an output buffering means for outputting amplified data, comprising:

a clock generating means for receiving an external clock signal and outputting internal clock signals; and a plurality of storing means for storing the outputs from each of the elements, being synchronized with the internal clock signal from the clock generating means.

12. A read only memory device having a memory cell array, an amplifier for amplifying data read out from the memory cell array and an output buffer for outputting amplified data, comprising:

a clock generator for receiving an external clock signal and outputting internal clock signals;

a first switch for connecting the row address decoder to the memory cell array, being synchronized with the internal clock signal from the clock generator;

a second switch for connecting the column address decoder to the memory cell array, being synchronized with the internal clock signal from the clock generator;

a third switch for connecting the output buffer to the memory cell array, being synchronized with the internal clock signal from the clock generator;

a row address decoder for selecting a word line in the memory cell array, comprising:

X-address buffer for buffering row address signals;

X-predecoder for predecoding the outputs from the X-address buffer; and

X-decoder for decoding the outputs from the X-predecoder;

a column decoder for selecting a bit line in the memory cell array, comprising:

Y-address buffer for buffering column address signals;

Y-predecoder for predecoding the outputs from the Y-address buffer; and

Y-decoder for decoding the outputs from the Y-predecoder;

a fourth switch for connecting the X-address buffer to the X-predecoder, being synchronized with the internal clock signal from the clock generator;

a fifth switch for connecting the X-predecoder to the X-decoder, being synchronized with the internal clock signal from the clock generator;

a sixth switch for connecting the Y-address buffer to the Y-predecoder, being synchronized with the internal clock signal from the clock generator; and a seventh switch for connecting the Y-predecoder to the Y-decoder, being synchronized with the internal clock signal from the clock generator.

13. The read only memory device in accordance with claim 12, wherein the clock generator further comprises a skew adjusting part for correcting a wave distortion from the external clock signal.

14. The read only memory device in accordance with claim 13, wherein the skew adjusting part is a phase-locked loop.

* * * * *